United States Patent
Ra

(10) Patent No.: US 8,643,272 B2
(45) Date of Patent: Feb. 4, 2014

(54) ORGANIC LIGHT EMITTING DIODE DISPLAY

(75) Inventor: Dong-Gyun Ra, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 158 days.

(21) Appl. No.: 13/244,077

(22) Filed: Sep. 23, 2011

(65) Prior Publication Data

US 2012/0146493 A1    Jun. 14, 2012

(30) Foreign Application Priority Data

Dec. 14, 2010    (KR) .................. 10-2010-0127646

(51) Int. Cl.
*H01J 1/62*    (2006.01)
*H01J 63/04*    (2006.01)

(52) U.S. Cl.
USPC ............................ 313/512; 313/506; 313/498

(58) Field of Classification Search
USPC .................................................. 313/498–512
See application file for complete search history.

(56) References Cited

U.S. PATENT DOCUMENTS

2008/0012474 A1*    1/2008   Sung et al. .................... 313/504
2010/0148665 A1*    6/2010   Farquhar et al. ............. 313/512

FOREIGN PATENT DOCUMENTS

| JP | 2001-237065 A | 8/2001 |
| JP | 2003-178885 A | 6/2003 |
| JP | 2006-150882 A | 6/2006 |
| KR | 10-2006-0089977 A | 8/2006 |

* cited by examiner

*Primary Examiner* — Anh Mai
*Assistant Examiner* — Zachary J Snyder
(74) *Attorney, Agent, or Firm* — Knobbe Martens Olson & Bear LLP

(57) ABSTRACT

An organic light emitting diode (OLED) display with improved display unit sealing performance is provided. The OLED display includes a substrate, a display unit formed over the substrate and including a plurality of pixels, a conductive contact layer disposed at a distance from the display unit around the display unit, and a sealing member facing the display unit and being fixed to the substrate by the conductive contact layer. The sealing member includes a plurality of metal layers laminated with an insulating adhesive layer formed therebetween, and the plurality of metal layers is electrically connected to the display unit through the conductive contact layer.

18 Claims, 10 Drawing Sheets

ORGANIC LIGHT EMITTING DIODE DISPLAY

RELATED APPLICATIONS

This application claims priority to and the benefit of Korean Patent Application No. 10-2010-0127646 filed in the Korean Intellectual Property Office on Dec. 14, 2010, the entire contents of which are incorporated herein by reference.

BACKGROUND

1. Field

The described technology relates generally to an organic light emitting diode (OLED) display. More particularly, the described technology relates generally to a technique of sealing a display unit.

2. Description of the Related Technology

An organic light emitting diode (OLED) display is a self-emission display device which includes self-emission organic light emitting elements to display images. Functions of a display including a plurality of organic light emitting elements are deteriorated when the display is exposed to moisture and oxygen, and thus it is important to seal the display to suppress the infiltration of external moisture and oxygen. Furthermore, as the area of the OLED display increases, a light thin sealing structure having excellent heat-radiating effect is required.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide an OLED display having advantages of improving the sealing performance of a display unit to increase display quality and life-span of the display unit and supply power to the display unit using a sealing structure.

An embodiment provides an OLED display comprising a substrate, a display unit formed on the substrate and including a plurality of pixels, a conductive contact layer disposed around the display unit at a distance from the display unit, and a sealing member facing the display unit and fixed onto the substrate through the conductive contact layer. The sealing member includes a plurality of metal layers laminated with an insulating adhesive layer formed therebetween and the plurality of metal layers is electrically connected to the display unit through the conductive contact layer.

The plurality of metal layer may be formed from one of metal foil or a metal plate. The plurality of metal layer may include at least one of aluminum, copper, tin and nickel.

The conductive contact layer may surround the edge of the display unit, have electric conductivity in the thickness direction of the substrate and have insulating property in other directions.

The OLED display may further comprise at least two contact parts disposed between the substrate and the conductive contact layer and connected to the display unit. The plurality of metal layers may be connected to different pad parts of the at least two pad parts through the conductive contact layer.

The plurality of metal layers may have an oxide layer formed on regions other than portions coming into contact with the conductive contact layer.

An embodiment provides an OLED display comprising a substrate, a display unit formed on the substrate and including a common power line and a common electrode, a conductive contact layer disposed around the display unit at a distance from the display unit, and a sealing member fixed onto the substrate through the conductive contact layer. The sealing member may include a first metal layer carrying a first electric signal for the common power line, a second metal layer overlapping the first metal layer and carrying a second electric signal for the common electrode, and an insulating adhesive layer disposed between the first metal layer and the second metal layer. The first metal layer and to the second metal layer may be electrically connected to the display unit through the conductive contact layer.

The OLED display may further comprise a bonding layer disposed between the display unit and the conductive contact layer on the substrate. The conductive contact layer may surround the display unit, have electric conductivity in thickness direction of the substrate and have insulating property in other directions.

The OLED display may further comprise a plurality of first pad parts disposed between the substrate and the conductive contact layer and connected to the common power line and a plurality of second pad parts connected to the common electrode. The first pad parts and the second pad parts may be arranged at intervals around the display unit.

The first metal layer may include a first center part facing the display unit and a plurality of third pad parts formed at intervals along the edge of the first center part. The second metal layer may include a second center part overlapping the first center part and a plurality of fourth pad parts formed at intervals along the edge of the second center part.

The third pad parts and the fourth pad parts may be alternately disposed at intervals along the edge of the sealing member.

The plurality of third pad parts may face the first pad parts in the thickness direction of the substrate, come into contact with the conductive contact layer and be connected to the first pad parts. The plurality of fourth pad parts may face the second pad parts in the thickness direction of the substrate, come into contact with the conductive contact layer and be connected to the second pad parts.

The first metal layer may include a first oxide layer formed on the first center part and the second metal layer may include a second oxide layer formed on the second center part.

The first metal layer and the second metal layer may be formed in the same shape, and the second metal layer may be rotated by 180° against the first metal layer and overlapping the first metal layer. The fourth pad parts of the second metal layer may be disposed between the third pad parts of the first metal layer and located at a distance from the third pad parts.

The OLED display includes multi-layered blocking structures in the thickness direction and the surface direction, and thus display unit sealing performance can be improved. Accordingly, the display quality and life-span of the display unit can be improved. The sealing member has satisfactory heat-radiating effect and low material cost and manufacturing cost and can be easily applied to a large-size OLED display.

Furthermore, the OLED display can improve the luminance uniformity of the display unit while implementing a large-size display unit and include a pad area located at one edge of the substrate to simplify the overall structure and manufacturing process of the OLED display and reduce the manufacturing cost.

DETAILED DESCRIPTION

Figure 1:
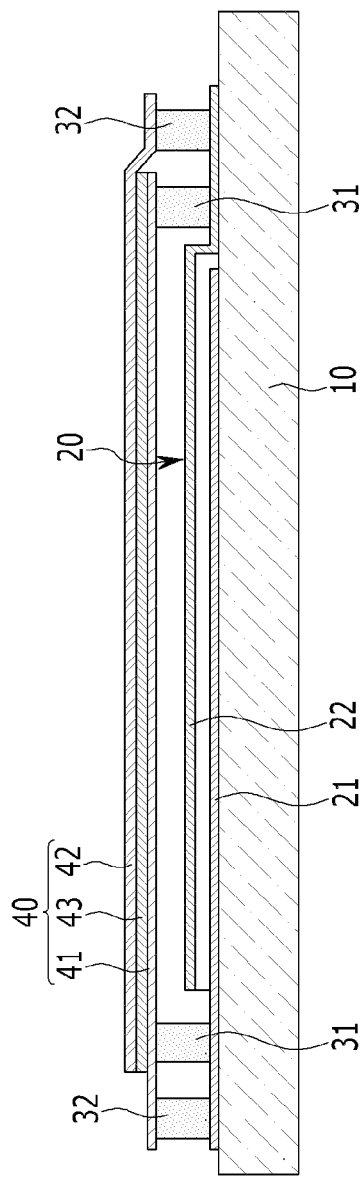
FIG. 1 is a cross-sectional view of an OLED display according to a first embodiment.

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification. Accordingly, the drawings and description are to be regarded as illustrative in nature and not restrictive. Like reference numerals designate like elements throughout the specification.

It will be understood that when an element such as a layer, film, region, or substrate is referred to as being "on" another element, it can be directly on the other element or intervening elements may also be present.

Throughout this specification and the claims that follow, when it is described that an element is "coupled" to another element, the element may be "directly coupled" to the other element or "electrically coupled" to the other element through a third element.

FIG. 1 is a cross-sectional view of an OLED display 100 according to a first embodiment.

Referring to FIG. 1, the OLED display 100 according to the first embodiment of the invention includes a substrate 10, a display unit 20 formed on the substrate 10, a bonding layer 31 and a conductive contact layer 32 located around the display unit 20 at a distance from the display unit 20, and a sealing member 40 that faces the substrate 10 and is fixed to the substrate 10 according to the bonding layer 31 and the conductive contact layer 32.

The display unit 20 includes a plurality of pixels each pixel having a driving circuit and an organic light emitting element controlled by the driving circuit. The driving circuit has at least two thin film transistors including a switching thin film transistor and a driving thin film transistor and at least one capacitor. The organic light emitting element includes a pixel electrode, an organic emission layer and a common electrode.

One of the pixel electrode and the common electrode is a hole injection electrode (anode) and the other is an electron injection electrode (cathode). The pixel electrode is formed for each pixel and connected to the driving thin film transistor of the corresponding pixel. The common electrode is commonly formed over the plurality of pixels.

In addition, the display unit 20 includes a gate line, a data line and a common power line for each pixel. The gate line transits a scan signal and the data line transmits a data signal. The common power line applies a common voltage to the driving thin film transistor. The common power line includes a first common power line parallel with the data line and a second common power line parallel with the gate line.

The substrate 10 is formed from transparent glass or a transparent polymer film and light from the display unit 20 transmits the substrate 10 to be emitted to the outside. The detailed structure of the display unit 20 will be described later. FIG. 1 shows the display unit 20 including the common power line 21 and the common electrode 22 in a simplified structure of three layers.

The bonding layer 31 is located around the display unit 20 and surrounds the display unit 20. The bonding layer 31 includes ultraviolet (UV) resin or thermosetting resin and may include epoxy resin, for example. A getter layer (not shown) is located between the display unit 20 and the bonding layer 31 and a moisture-absorbing filler (not shown) is provided between the substrate 10 and the sealing member 40 inside the bonding layer 31.

Figure 2:
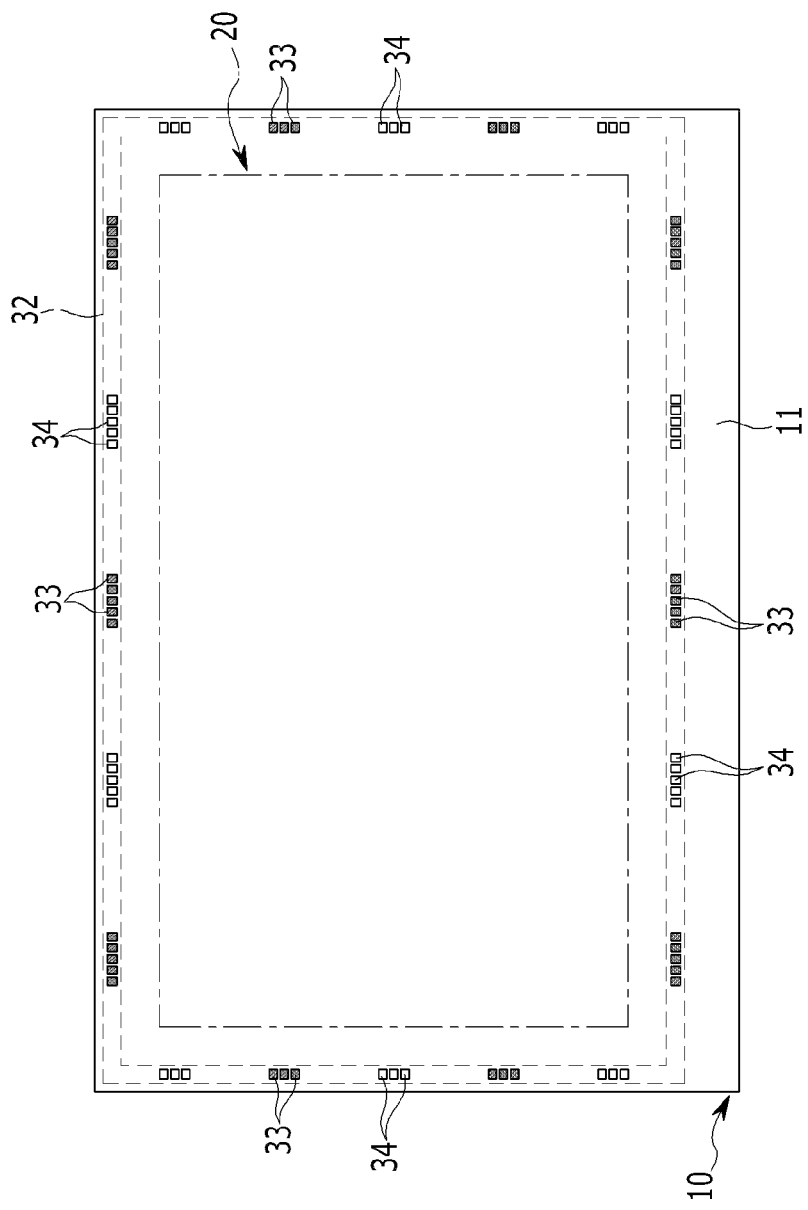
FIG. 2 is a top plan view of a substrate of the OLED display shown in FIG. 1.

FIG. 2 is a top plan view of the substrate 10 of the OLED display shown in FIG. 1.

Referring to FIGS. 1 and 2, first pad parts 33 and second pad parts 34 are located on the substrate 10 outside the bonding layer 31. The first pad parts 33 are connected to the common power line 21 of the display unit 20 and the second pad parts 34 are connected to the common electrode 22 of the display unit 20.

The first pad parts 33 and the second pad parts 34 are formed around the four edges of the display unit 34 and neighboring first and second pad parts 33 are located at a distance from each other. Here, a pad area 11 on which a chip on film (COF) and a printed circuit board (PCB), which are not shown, are mounted is located outside the first and second pad parts 33 and 34 corresponding to one edge of the substrate 10.

FIG. 2 shows the first pad parts 33 in a dot pattern to distinguish the first pad parts 33 from the second pad parts 34. The first pad parts 33 and the second pad parts 34 are simplified in FIG. 2 and the positions and numbers of the first pad parts 33 and the second pad parts 34 are not limited. A connection structure of the first pad parts 33 and the common power line 21 and a connection structure of the second pad parts 34 and the common electrode 22 will be described later.

Figure 3:
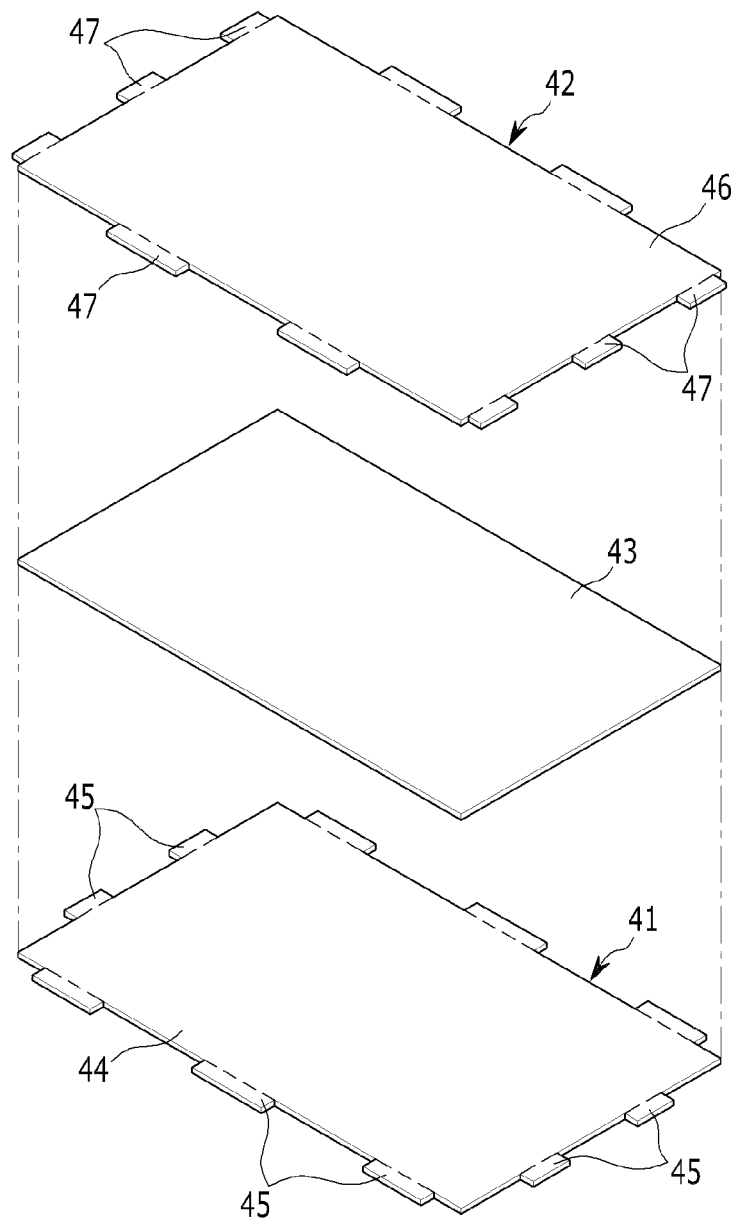
FIG. 3 is an exploded perspective view of a sealing member of the OLED display shown in FIG. 1.
Figure 4:
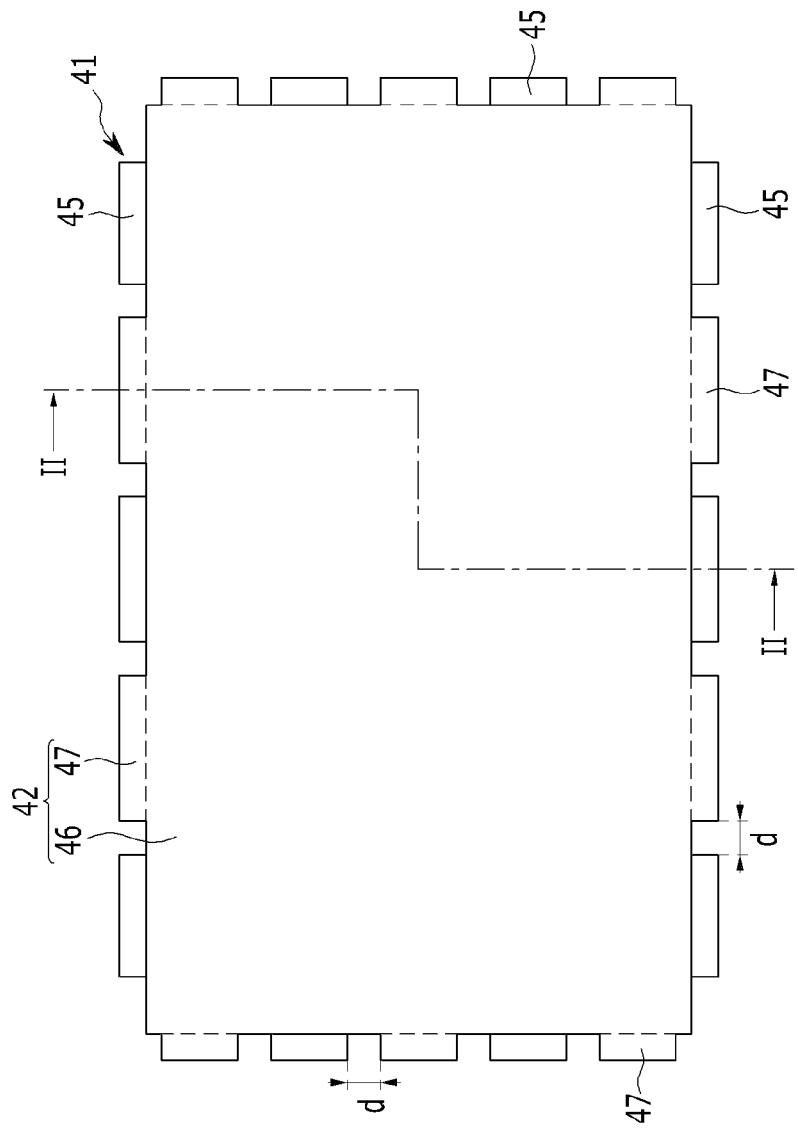
FIG. 4 is a top plan view of a sealing member of the OLED display shown in FIG. 1.

FIG. 3 is an exploded perspective view of the sealing member 40 of the OLED display shown in FIG. 1 and FIG. 4 is a top plan view showing a combination state of the sealing member 40. FIG. 1 shows the cross section taken along line II-II of FIG. 4.

Referring to FIGS. 1, 2, 3 and 4, the sealing member 40 faces the display unit 20 and is fixed onto the bonding layer 31 to seal the display unit 20. The sealing member 40 is formed in a size suitable to cover the area of the substrate 10 other than the pad area 11. The sealing member 40 is composed of a plurality of metal layers 41 and 42 laminated with an insulating adhesive layer 43 formed therebetween. The metal layers 41 and 42 are formed from metal foil or a metal plate and effectively suppress infiltration of external moisture and oxygen.

Specifically, the sealing member 40 includes the first metal layer 41 facing the display unit 20, the insulating adhesive layer 43 formed on the first metal layer 41, and the second metal layer 42 formed on the insulating adhesive layer 43. The first metal layer 41 partially comes into contact with the bonding layer 31 and is fixed to the substrate 10 according to the bonding layer 31 and the second metal layer 42 is fixed onto and insulated from the first metal layer 41 according to the insulating adhesive layer 43.

The first metal layer 41 and the second metal layer 42 are formed from metal foil or a metal plate having a thickness of about 1 to 3 mm, which includes at least one of aluminum (Al), copper (Cu), tin (Sn) and nickel (Ni). The metal foil has the advantage of reducing the thickness of the sealing member 40 and the metal plate has the advantage of improving the strength of the sealing member 40. The insulating adhesive layer 43 may include epoxy resin or other polymer resins.

The component from the external moisture and oxygen, which infiltrates along the thickness direction (vertical direction in FIG. 1) of the OLED display 100, is blocked by the second metal layer 42, the insulating adhesive layer 43, the first metal layer 41 and the moisture-absorbing filler. The component infiltrating between the substrate 10 and the sealing member 40 along the surface direction of the substrate 10 (horizontal direction in FIG. 1) is blocked by the conductive contact layer 32, the bonding layer 31, the getter layer and the moisture-absorbing filler.

The OLED display 100 according to the first embodiment of the invention can improve the sealing performance of the display unit 20 since the multi-layer blocking structure is formed along the thickness direction and the surface direction of the OLED display. Accordingly, deterioration of the display unit 20 due to moisture and oxygen can be suppressed to improve display quality and increase life-span of the OLED display. Furthermore, the sealing member 40 including the metal layers 41 and 42 has satisfactory heat-radiating effect and low material cost and manufacturing cost and can be easily applied to the large-size OLED display 100 with the display unit 20 having a diagonal length of more than 700 mm.

The first metal layer 41 is connected to the common power line 21 of the display unit 20 through the conductive contact layer 32 and the first pad parts 33 to supply a first electric signal to the common power line 21. The second metal layer 42 is connected to the common electrode 22 of the display unit 20 through the conductive contact layer 32 and the second pad parts 34 to provide a second electric signal to the common electrode 22. To achieve this, external input terminals (not shown) are attached to the first metal layer 41 and the second metal layer 42 to respectively supply the first electric signal and the second electric signal to the first metal layer 41 and the second metal layer 42.

The first metal layer 41 includes a first center part 44 facing the display unit 20 and the bonding layer 31 and a plurality of third pad parts 45 formed at intervals around the first center part 44. The third pad parts 45 are formed in positions corresponding to the first pad parts 33 formed on the substrate 10 and face the first pad parts 33 with the conductive contact layer 32 formed therebetween. The third pad parts 45 are bonded to the conductive contact layer 32 and connected to the first pad parts 33.

The second metal layer 42 includes a second center part 46 overlapping the first center part 44 and a plurality of fourth pad parts 47 formed at intervals along the edge of the second center part 46. The fourth pad parts 47 are formed in positions corresponding to the second pad parts 34 formed on the substrate 10 and face the second pad parts 34 with the conductive contact layer 32 formed therebetween. The fourth pad parts 47 are bonded to the conductive contact layer 32 and connected to the second pad parts 34.

The third pad parts 45 and the fourth pad parts 47 are formed along the edge of the sealing member 40 at intervals of d (refer to FIG. 4) such that the fourth pad parts 47 are not superposed on the third pad parts 45 and not connected to the third pad parts 45. The insulating adhesive layer 43 may be located between the first center part 44 and the second center part 46. The positions and numbers of the third pad parts 45 and the fourth pad parts 47 shown in FIGS. 3 and 4 are not limited to the shown embodiment and can be varied.

The conductive contact layer 32 is located around the bonding layer 31. Here, the conductive contact layer 32 has conductivity only in the thickness direction and has insulating property in other directions. Accordingly, the single conductive contact layer 32 can be formed on the substrate 10 irrespective of the positions of the first, second, third and fourth pad parts 33, 34, 45 and 47 and the first metal layer 41 and the second metal layer 42 do not short-circuit even when the conductive contact layer 32 comes into contact with all the first, second, third and fourth pad parts 33, 34, 45 and 47.

The common power line 21 of the display unit 20 is located around the top, bottom, left and right edges of the display unit 20 and is uniformly provided with the first electric signal. The common electrode 22 of the display unit 20 is located around the top, bottom, left and right edges of the display unit 20 and is uniformly provided with the second electric signal. Accordingly, the OLED display 100 according to the first embodiment of the invention can minimize luminance non-uniformity of the display unit while achieving the large-size display unit 20.

If the common power line 21 and the common electrode 22 are connected to the chip on film mounted on the pad area 11 through electrical connecting lines to receive electric signals from the chip on film, the luminance uniformity of the display unit 20 is deteriorated since connecting line resistance increases as the area of the display unit 20 increases. Accordingly, it is required to form pad areas at all the top, bottom, left and right edges of the substrate 10 to improve the luminance uniformity of the display unit 20. In this case, the overall structure and manufacturing process of the OLED display become complicated and the manufacturing cost increases.

However, the luminance uniformity of the large-size display unit 20 can be improved even though the pad area 11 is formed at one edge of the substrate 10 in the OLED display 100 according to the first embodiment of the invention, and thus the overall structure and manufacturing process of the OLED display 100 can be simplified and the manufacturing cost can be reduced.

Figure 5:
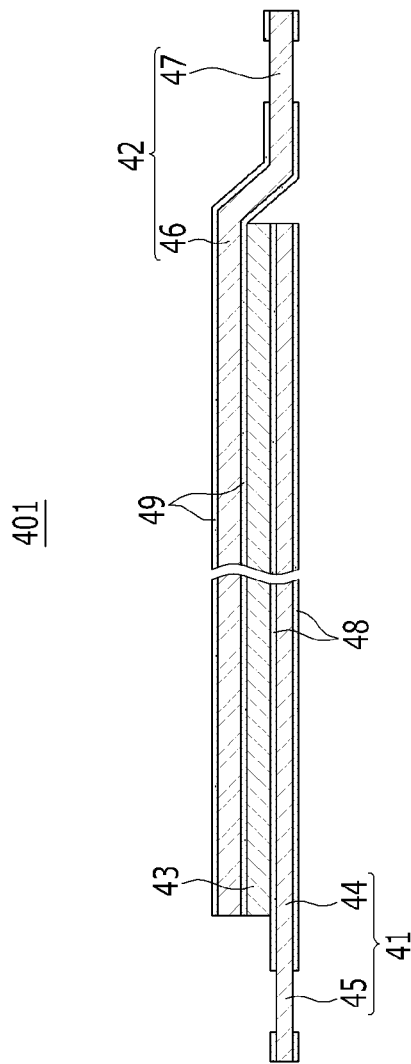
FIG. 5 is a cross-sectional view of a sealing member of an OLED display according to a second embodiment.

FIG. 5 is a cross-sectional view of a sealing member 401 of an OLED display according to a second embodiment.

Referring to FIG. 5, the OLED display according to the second embodiment of the invention has the same configuration as the above-described OLED display according to the first embodiment except the OLED display according to the second embodiment includes oxide layers 48 and 49 formed on parts of the metal layers 41 and 42. Like elements of the OLED displays of the first and second embodiments are denoted by like reference numerals.

The first metal layer 41 includes the first oxide layer 48 formed on the first center part 44 and the second metal layer 42 includes the second oxide layer 49 formed on the second center part 46.

The bottom faces of the third parts 45 and the fourth pad parts 47, based on the cross-sectional view of FIG. 5, come into contact with the conductive contact layer 32 shown in FIG. 1 and the top surfaces of the third pad parts 45 and the fourth pad parts 47 are connected to external input terminals, and thus the first and second oxide layers 48 and 49 are not formed on the third pad parts 45 and the fourth pad parts 47. However, the first oxide layer 48 may be formed along the edge of the third pad parts 45 and the second oxide layer 49 may be formed along the edge of the fourth pad parts 47.

When a mask layer (not shown) for the inhibition of oxidation is formed on the third pad parts 45 and the fourth pad parts 47 and then electrochemical reaction is produced in the first metal layer 41 and the second metal layer 42, the first oxide layer 48 and the second oxide layer 49 are respectively formed on areas other than the area on which the mask layer is formed, that is, the first center part 44 and the second center part 46. Then, the mask layer is removed to expose the third pad parts 45 and the fourth pad parts 47.

The first and second oxide layers 48 and 49 are aluminum oxide ($Al_2O_3$) layers when the first and second metal layers 41 and 42 are formed of aluminum and copper oxide (CuO) layers when the first and second metal layers 41 and 42 are formed of copper.

As the first and second oxide layers 48 and 49 are formed on the first and second metal layers 41 and 42 other than the third and fourth pad parts 45 and 47, as described above, unintended short-circuit can be effectively avoided in the process of handling the first and second metal layers 41 and 42 and the process of assembling the sealing member 401 and bonding the sealing member 401 onto the substrate 10 (refer to FIG. 1).

While both the bottom faces of the third and fourth pad parts 45 and 47 come into contact with the conductive contact layer 32 shown in FIG. 1, external connecting terminals are connected to some of the third pad parts 45 and some of the fourth pad parts 47. Accordingly, insulating tapes (not shown) are attached to or the first and second oxide layers 48 and 49 are formed on the third pad parts 45 and the fourth pad parts 47, which are not connected to the external connecting terminals.

Figure 6A:
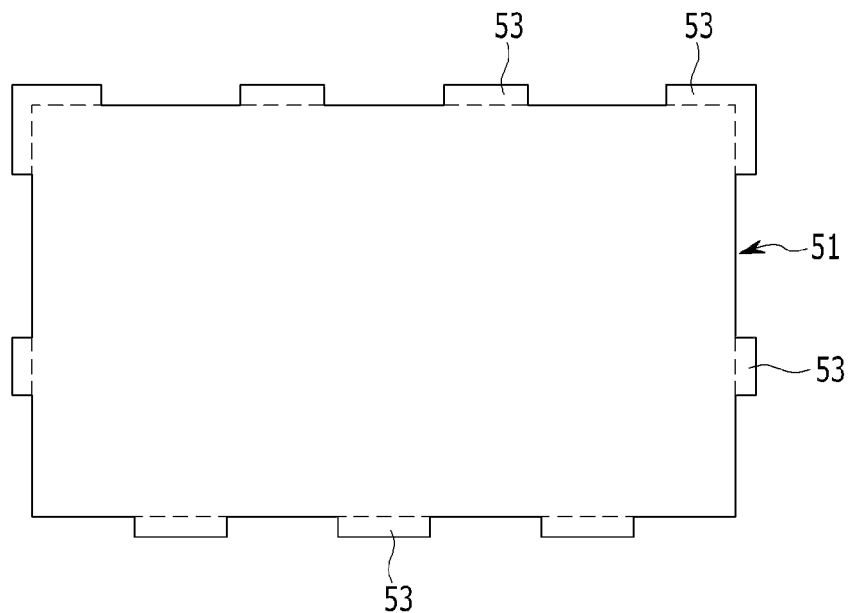
FIG. 6A is a top plan view of a sealing member of an OLED display according to a third embodiment.
Figure 6B:
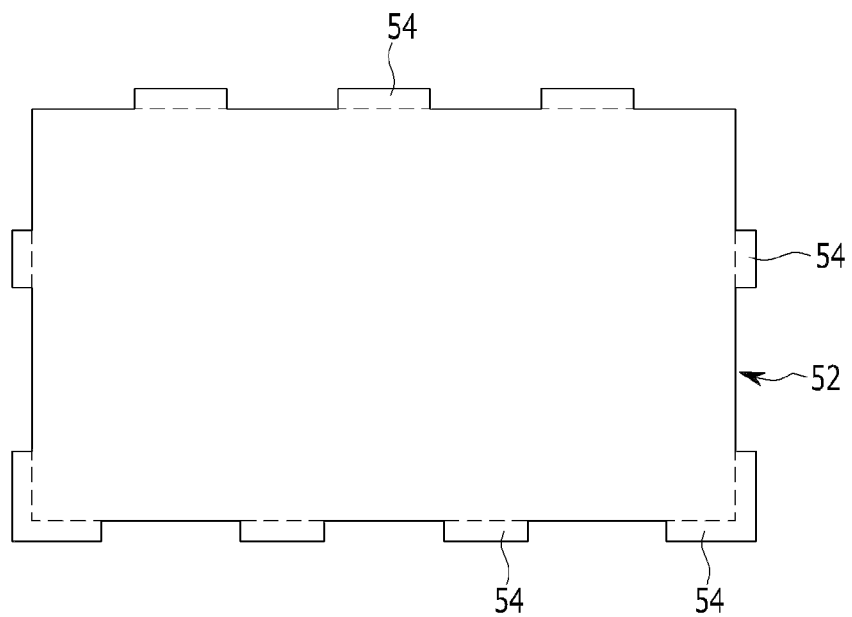
FIG. 6B is a top plan view of a second metal layer of a sealing member of an OLED display according to the third embodiment.
Figure 6C:
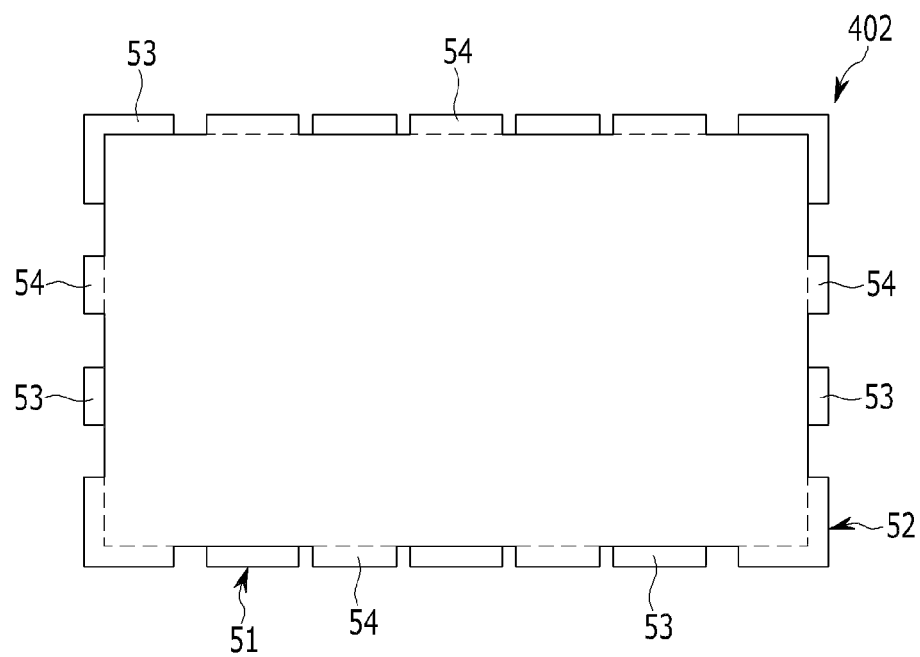
FIG. 6C is a top plan view of the sealing member of the OLED display according to the third embodiment.

FIG. 6A and FIG. 6B are top plan views of first and second metal layers forming a sealing member 402 of an OLED display according to a third embodiment and FIG. 6C is a top plan view of the sealing member 402, which shows superposition of the first and second metal layers respectively shown in FIGS. 6A and 6B.

Referring to FIGS. 6A, 6B and FIG. 6C, the OLED display according to the third embodiment has a structure similar to that of the OLED display according to the first or second embodiment except first and second metal layers 51 and 52 are formed in the same shape and then the second metal layer 52 is rotated by 180° against the first metal layer 51 and laminated on the first metal layer 51 in the third embodiment. Like elements in the first and third embodiments are denoted by like reference numerals.

The second metal layer 52 is initially formed in the same shape as the first metal layer 51, rotated by 180° against the first metal layer 51 during an assembling process and then laminated on the first metal layer 51. Here, it is required that fourth pad parts 54 of the second metal layer 52 are not superposed on third pad parts 53 of the first metal layer 51, and thus the fourth pad parts 54 are formed such that the fourth pad parts 54 are located between the third pad parts 53 after the second metal layer 52 is rotated.

The first pad parts 33 and the second pad parts 34 located on the substrate 10 are formed in positions corresponding to the third pad parts 53 and the fourth pad parts 54. As the first and second metal layers 51 and 52 are formed in the same shape, as described above, a process of manufacturing the sealing member 402 can be further simplified.

Figure 7:
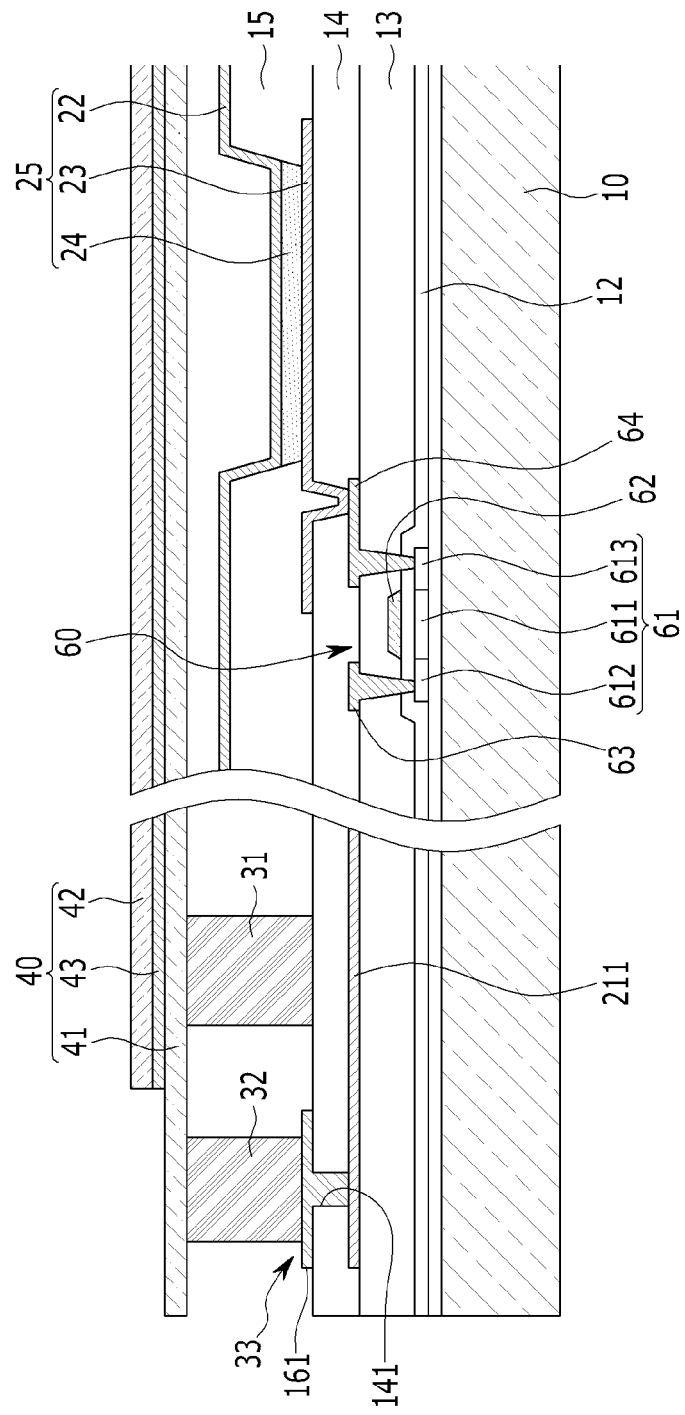
FIGS. 7, 8 and 9 are cross-sectional views of the OLED display shown in FIG. 1.
Figure 8:
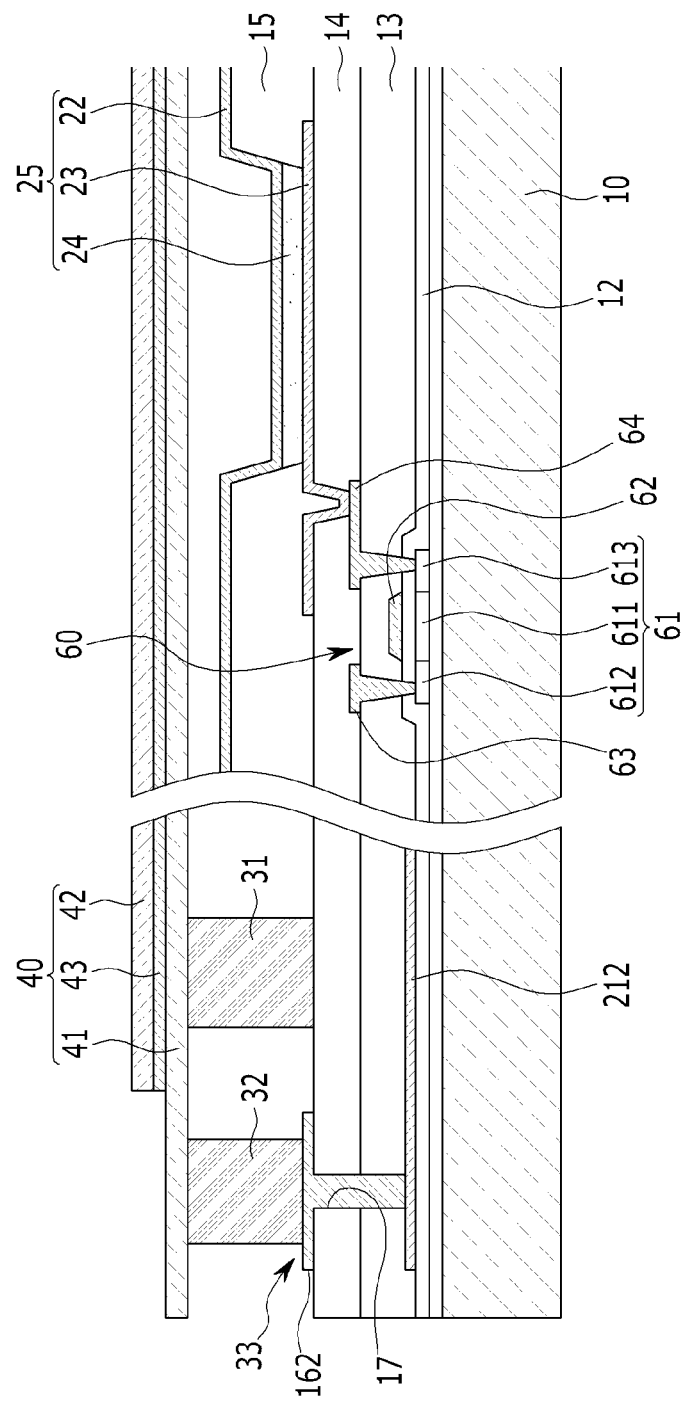
Figure 9:
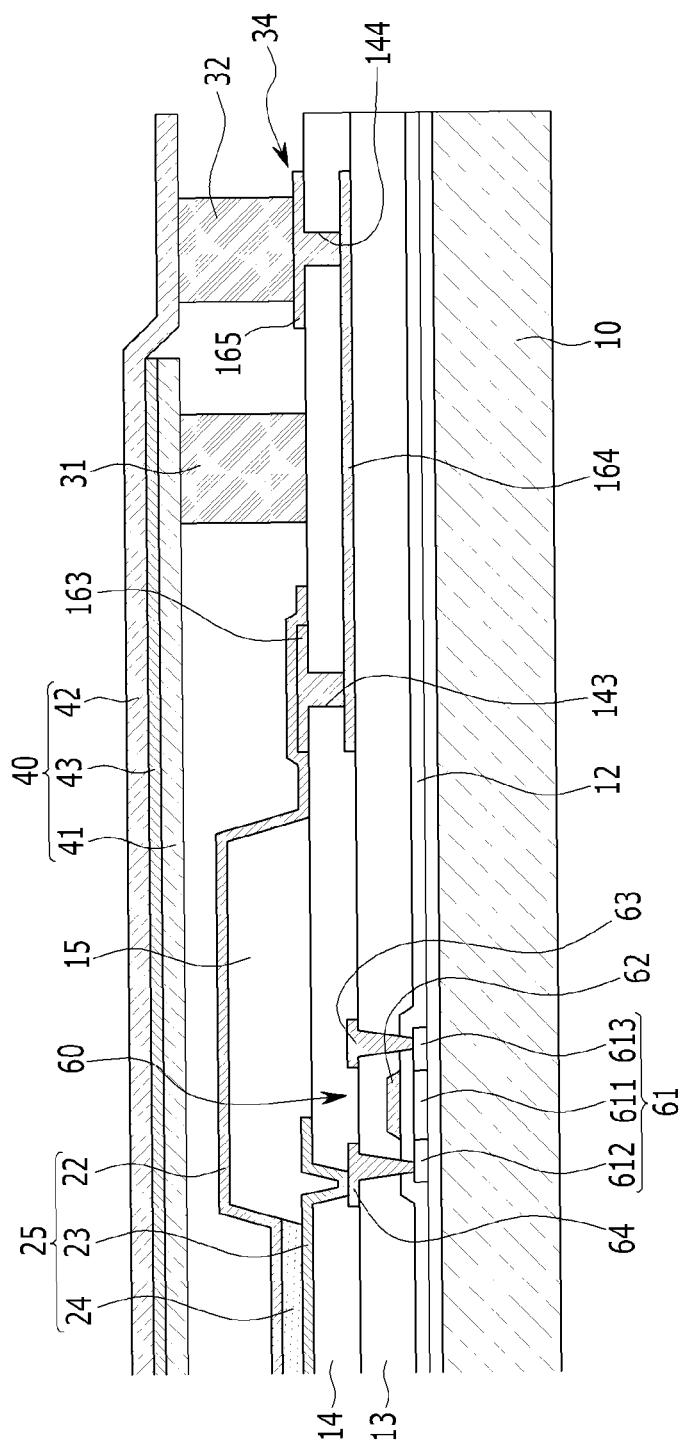

Although the sealing member includes the two metal layers to supply the two electric signals in the above embodiments, the sealing member can provide three or more electric signals. If the sealing member provides N electric signals, the sealing member includes (N−1) insulating adhesive layers and N metal layers laminated with the insulating adhesive layers formed between the metal layers. Referring to FIGS. 7, 8 and 9, an organic light emitting element 25 and a driving circuit are formed in each pixel of the display unit, as described above. The driving circuit includes at least two thin film transistors and at least one capacitor. FIGS. 7, 8 and 9 show a single thin film transistor 60 and the single organic light emitting element 25 disposed in the display unit.

The thin film transistor 60 includes a semiconductor layer 61, a gate electrode 62, a source electrode 63 and a drain electrode 64. The semiconductor layer 61 is formed of polysilicon and includes a channel region 611, a source region 612 and a drain region 613. The channel region 611 is an intrinsic semiconductor and the source and drain regions 612 and 613 correspond to an impurity-undoped semiconductor.

The gate electrode 62 is disposed on the channel region 611 of the semiconductor layer 61 with the gate insulating layer 12 interposed therebetween. The source electrode 63 and the drain electrode 64 are disposed on the gate electrode 62 with an interlayer insulating film 13 formed therebetween and respectively connected to the source region 612 and the drain region 613 through contact holes formed in the interlayer insulating film 13. A planarization layer 14 is formed on the source electrode 63 and the drain electrode 64 and a pixel electrode 23 is disposed on the planarization layer 14. The pixel electrode 23 is connected to the drain electrode 64 through a contact hole formed in the planarization layer 14.

A pixel defining layer 15 is disposed on the pixel electrode 23 and the planarization layer 14. The pixel defining layer 15 includes an opening corresponding to each pixel and exposes part of the pixel electrode 23 through the opening. An organic emission layer 24 is formed on the exposed portion of the pixel electrode 23 and the common electrode 22 is formed on the overall display unit to cover the organic emission layer 24 and the pixel defining layer 15. The pixel electrode 23, the organic emission layer 24 and the common electrode 22 form the organic light emitting element 25.

The pixel electrode 23 may be a hole injection electrode and the common electrode 22 may be an electron injection electrode. In this case, the organic emission layer 24 is formed of a hole injection layer (HIL), a hole transport layer (HTL), an emission layer, an electron transport layer (ETL) and an electron injection layer (EIL) sequentially laminated on the pixel electrode 23. Holes and electrons are injected into the organic emission layer 24 from the pixel electrode 23 and the common electrode 22 and light is emitted when excitons generated from combinations of the injected holes and electrons drop from the excited state to the ground state.

The pixel electrode 23 is formed from a transmissive conductive layer and the common electrode 22 is formed from a reflective conductive layer. Light emitted from the organic emission layer 24 is reflected by the common electrode 22 and emitted to the outside via the substrate 10. This light emitting structure is referred to as a backlit type. The pixel electrode 23 may be formed from a three-layer film of ITO(indium tin oxide)/Ag/ITO and the common electrode 22 may include Ag or Al.

Referring to FIGS. 7 and 8, a first common power line 211 and a second common power line 212 may be formed at the same level as one of the gate electrode 62 and the source/drain electrodes 63 and 64.

The ends of the first common power line 211 and the second common power line 212 are extended to the outside of the display unit. At least one of four insulating layers formed in the display unit is extended to the outside of the display unit. For example, the end of the first common power line 211 may be covered with the planarization layer 14 and the end of the second common power line 212 may be covered with the interlayer insulating film 13 and the planarization layer 14.

The planarization layer 14 has a first opening 141 exposing the end of the first common power line 211 and a first pad conductive layer 161 is formed on the planarization layer 14 and connected to the first common power line 211 through the first opening 141. The first pad parts 33 disposed at the longer sides of the substrate 10 in FIGS. 1 and 10 can be defined as the first pad conductive layer 161.

The interlayer insulating film 13 and the planarization layer 14 have a second opening 17 exposing the end of the second common power line 212 and a second pad conductive layer 162 is formed on the planarization layer 14 and connected to the second common power line 212 through the second opening 17. The first pad parts 33 located at the shorter sides of the substrate 10 in FIGS. 1 and 10 can be defined as the second pad conductive layer 162. The first pad conductive layer 161 and the second pad conductive layer 162 may be formed at the same level as the pixel electrode 23 and made of the same material as the pixel electrode 23.

Referring to FIG. 9, the common electrode 22 is disposed inside the bonding layer 31 and the second pad parts 34 are formed over the inside and outside the bonding layer 31 to connect the common electrode 22 and the conductive contact layer 32. The second pad parts 34 include a third pad conductive layer 163, a fourth pad conductive layer 164 and a fifth pad conductive layer 165.

The third pad conductive layer 163 is disposed inside the bonding layer 31 and comes into contact with the common electrode 22. The fourth pad conductive layer 164 is connected to the third pad conductive layer 163 through a third opening 143 formed in the planarization layer 14 and disposed over the inside and outside of the bonding layer 31. The fifth pad conductive layer 165 is disposed between the conductive contact layer 32 and the planarization layer 14 and connected to the fourth pad conductive layer 164 through a fourth contact hole 144 formed in the planarization layer 14.

The third pad conductive layer 163 and the fifth pad conductive layer 165 may be formed at the same level as the pixel electrode 23 and formed of the same material as the pixel electrode 23. The fourth pad conductive layer 164 may be formed at the same level as the source/drain electrodes 63 and 64 and formed of the same material as the source/drain electrodes 63 and 64. The detailed structure of the second pad parts 34 is not limited to the shown example and any structure that can electrically connect the common electrode 22 of the display unit and the conductive contact layer 32 formed outside the display unit can be used.

The display unit shown in FIGS. 7, 8 and 9 is not limited to the shown example and the structures of the thin film transistor 60 and the organic light emitting element 25 can be varied.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

<Description of symbols>

| 100: organic light emitting diode (OLED) | 10: substrate display |
|---|---|
| 20: display unit | 21: common power line |
| 22: common electrode | 23: pixel electrode |
| 24: organic emission layer | 25: organic light emitting element |
| 31: bonding layer | 32: conductive contact layer |
| 33: first pad part | 34: second pad part |
| 40: sealing member | 41, 51: first metal layer |
| 42, 52: second metal layer | 43: insulating adhesive layer |
| 45: third pad part | 47: fourth pad part |
| 60: thin film transistor | |

What is claimed is:

1. An organic light emitting diode (OLED) display comprising:
   a substrate;
   a display unit formed over the substrate and comprising a plurality of pixels;
   a sealing member opposing the substrate, wherein the display unit is interposed between the substrate and the sealing member,
   wherein the sealing member comprises a plurality of metal layers comprising first and second metal layers and an insulation layer disposed between the first and second metal layers, wherein the first metal layer is disposed between the display unit and the second metal layer; and
   a conductive contact layer interposed between the substrate and the sealing member,
   wherein the first and second layers are electrically connected to first and second portions of the display unit, respectively, through the conductive contact layer.

2. The OLED display of claim 1, wherein each of the first and second metal layers is formed from one of metal foil and a metal plate.

3. The OLED display of claim 2, wherein the first and second metal layers comprise at least one of aluminum, copper, tin and nickel.

4. The OLED display of claim 1, wherein the conductive contact layer surrounds the display unit, is electrically conductive in the thickness direction of the substrate and is electrically non-conductive in other directions.

5. The OLED display of claim 1, further comprising
   first and second pad terminals disposed between the substrate and the conductive contact layer and electrically connected to the first and second portions of the display unit, respectively,
   wherein the first and second metal layers are respectively electrically connected to the first and second pad terminals through the conductive contact layer.

6. The OLED display of claim 1, wherein an oxide layer is formed over each of the first and second metal layers, wherein each of the first and second metal layers comprises a surface being in contact with the conductive contact layer and is not covered by the oxide layer.

7. An organic light emitting diode (OLED) display comprising:
   a substrate comprising a major surface;
   a display unit formed over the substrate and comprising a common power line and a common electrode;
   a sealing member opposing the substrate, wherein the display unit is interposed between the substrate and the sealing member,
   wherein the sealing member comprise:
      a first metal layer configured to carry a first electric signal for the common power line;
      a second metal layer overlapping the first metal layer when viewed in a direction perpendicular to the major surface and configured to carry a second electric signal for the common electrode; and an insulation layer disposed between the first metal layer and the second metal layer, and a conductive contact layer interposed between the substrate and the sealing member, wherein the first metal layer and the second metal layer are electrically connected to the common power line and the common electrode of the display unit, respectively, through the conductive contact layer.

8. The OLED display of claim 7, further comprising a bonding layer disposed between the display unit and the conductive contact layer when viewed in the direction.

9. The OLED display of claim 7, wherein the conductive contact layer surrounds the display unit, is electrically conductive in the direction and is electrically non-conductive in directions perpendicular thereto.

10. The OLED display of claim 7, further comprising a plurality of first pad terminals disposed between the substrate and the conductive contact layer and connected to the common power line and a plurality of second pad terminals connected to the common electrode.

11. The OLED display of claim 10, wherein the first pad terminals and the second pad terminals are arranged around the display unit.

12. The OLED display of claim 10, wherein the first metal layer comprises a first center part opposing the display unit and a plurality of third pad tabs formed along edges of the first center part, and wherein the second metal layer comprises a second center part overlapping the first center part and a plurality of fourth pad tabs formed along edges of the second center part.

13. The OLED display of claim 12, wherein the third pad tabs and the fourth pad tabs are alternately arranged along the periphery of the sealing member and spaced from each other.

14. The OLED display of claim 12, wherein the plurality of third pad tabs overlap the first pad terminals when viewed in the direction and contact with the conductive contact layer to be electrically connected to the first pad terminals.

15. The OLED display of claim 12, wherein the plurality of fourth pad tabs overlap the second pad terminals when viewed in the direction and contact with the conductive contact layer to be electrically connected to the second pad terminals.

16. The OLED display of claim 12, wherein the sealing member comprises a first oxide layer formed over the first center part, and wherein the sealing member comprises a second oxide layer formed over the second center part.

17. The OLED display of claim 11, wherein the first metal layer and the second metal layer are formed in the same shape, wherein the second metal layer has an orientation which is rotated by 180° with respect to that of the first metal layer and overlaps the first metal layer.

18. The OLED display of claim 17, wherein one of the fourth pad tabs of the second metal layer is disposed between two immediately neighboring third pad tabs of the first metal layer when viewed in the direction.

* * * * *